(12) United States Patent
Koizumi (10) Patent No.: US 11,515,194 B2
(45) Date of Patent: Nov. 29, 2022

(54) SUBSTRATE PROCESSING APPARATUS, SUBSTRATE PROCESSING SYSTEM, AND SUBSTRATE TRANSPORTING METHOD

(71) Applicant: Tokyo Electron Limited, Tokyo (JP)

(72) Inventor: Katsuyuki Koizumi, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 274 days.

(21) Appl. No.: 16/897,437

(22) Filed: Jun. 10, 2020

(65) Prior Publication Data

US 2020/0402834 A1    Dec. 24, 2020

(30) Foreign Application Priority Data

Jun. 18, 2019 (JP) .............................. JP2019-113134

(51) Int. Cl.
| | |
|---|---|
| *H01L 21/687* | (2006.01) |
| *H01L 21/67* | (2006.01) |
| *H01J 37/32* | (2006.01) |
| *H01L 21/683* | (2006.01) |

(52) U.S. Cl.
CPC .. *H01L 21/68742* (2013.01); *H01J 37/32642* (2013.01); *H01J 37/32715* (2013.01); *H01L 21/67069* (2013.01); *H01L 21/6831* (2013.01); *H01L 21/68735* (2013.01); *H01J 2237/334* (2013.01)

(58) Field of Classification Search
CPC ......... H01L 21/68742; H01L 21/67069; H01L 21/6831; H01L 21/68735; H01L 21/67745; H01J 37/32642; H01J 37/32715; H01J 2237/334

USPC ........................................................ 361/234
See application file for complete search history.

(56) References Cited

U.S. PATENT DOCUMENTS

| | | | | |
|---|---|---|---|---|
| 10,655,224 | B2* | 5/2020 | Agarwal | ........... H01L 21/68735 |
| 2002/0144657 | A1* | 10/2002 | Chiang | ............... C23C 16/4412 |
| | | | | 118/728 |
| 2015/0303092 | A1* | 10/2015 | Kawabata | ............... G01R 19/25 |
| | | | | 361/234 |
| 2018/0247852 | A1* | 8/2018 | Shiraiwa | ............. H01L 21/6831 |
| 2018/0308737 | A1* | 10/2018 | Moriya | ............... H01L 21/6875 |
| 2019/0279894 | A1* | 9/2019 | Uchida | ............. H01L 21/68735 |

FOREIGN PATENT DOCUMENTS

JP    H06-112303    4/1994

* cited by examiner

*Primary Examiner* — Dharti H Patel
(74) *Attorney, Agent, or Firm* — IPUSA, PLLC (57) ABSTRACT

A substrate processing apparatus includes a stage including a first section and a second section, pins, a lifter configured to raise and lower the pins, and a controller configured to control the lifter. On the first section, a substrate is placed. On the second section, an edge ring is placed. The second section is provided at a periphery of the first section. Also, at the second section, holes are provided. The pins are provided in the respective holes so as to move up and down through the holes.

5 Claims, 9 Drawing Sheets

SUBSTRATE PROCESSING APPARATUS, SUBSTRATE PROCESSING SYSTEM, AND SUBSTRATE TRANSPORTING METHOD

CROSS-REFERENCE TO RELATED APPLICATIONS

This patent application is based upon and claims priority to Japanese Patent Application No. 2019-113134 filed on Jun. 18, 2019, the entire contents of which are incorporated herein by reference.

TECHNICAL FIELD

The present disclosure relates to a substrate processing apparatus, a substrate processing system, and a substrate transporting method.

BACKGROUND

There is known a substrate processing apparatus in which a process gas is introduced into a chamber to apply a desired process, such as etching, on a substrate.

Patent Document 1 describes a wafer processing method. In the wafer processing method, when a wafer is to be fixed to an electrostatic chuck, pusher pins are lowered to place the wafer on the electrostatic chuck while the pusher pins are in contact with the wafer; and when the wafer is released from the electrostatic chuck, the pusher pins are lifted to release the wafer from the electrostatic chuck while the pusher pins are in contact with the wafer.

RELATED ART DOCUMENT

Patent Document

[Patent Document 1] Japanese Laid-open Patent Application Publication No. 06-112303

SUMMARY

In one aspect, the present disclosure provides a substrate processing apparatus, a substrate processing system, and a substrate transporting method that reduces occurrence of defects caused by an electrostatic chuck.

In order to solve the above-described problem, according to one aspect, an apparatus for substrate processing is provided that includes a stage including a first section and a second section, pins, a lifter configured to raise and lower the pins, and a controller configured to control the lifter. On the first section, a substrate is placed. On the second section, an edge ring is placed. The second section is provided at a periphery of the first section. Also, at the second section, holes are provided. The pins are provided in the respective holes so as to move up and down through the holes.

DETAILED DESCRIPTION OF EMBODIMENTS

Hereinafter, a non-limiting embodiment of the present disclosure will be described with reference to the accompanying drawings. In the accompanying drawings, the same or corresponding reference numerals shall be attached to the same or corresponding components and redundant descriptions will not be provided.

<Plasma Processing Apparatus>

Figure 1:
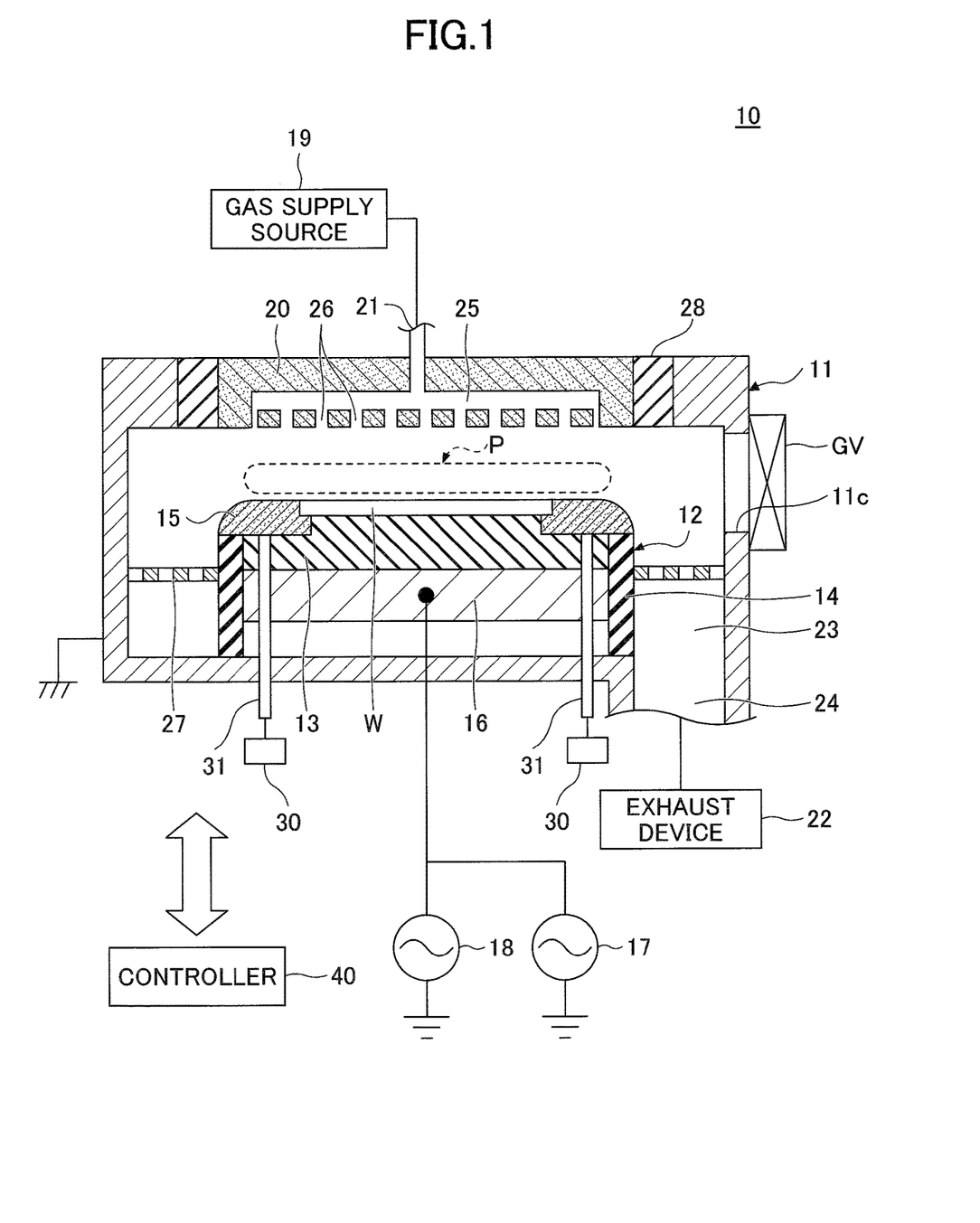
FIG. 1 is a cross-sectional diagram illustrating an example of a plasma processing apparatus according to an embodiment.

First, a plasma processing apparatus (substrate processing apparatus) 10 according to an embodiment will be described with reference to FIG. 1. FIG. 1 illustrates a cross-sectional diagram of a parallel plate, capacitively coupled type plasma (CCP) processing apparatus, as an example of the plasma processing apparatus 10 according to the present embodiment.

First, the configuration of the plasma processing apparatus 10 illustrated in FIG. 1 will be described. The plasma processing apparatus 10 includes a process chamber 11 and a mounting platform 12 disposed therein. The process chamber 11 is a cylindrical container made of, for example, aluminum having a surface treated by anodic oxidation (anodizing treatment), and is grounded. The mounting platform 12 includes a base 16 and an electrostatic chuck 13 that is placed on the base 16. The mounting platform 12 is disposed at the bottom of the process chamber 11 via a retainer 14 made of an insulating material. The mounting platform 12 may also be referred to as a "stage".

The base 16 is formed of aluminum or the like. The electrostatic chuck 13 is formed of a dielectric such as alumina ($Al_2O_3$), and includes a mechanism that holds a wafer W with electrostatic attractive force. A wafer W is placed on the center of the electrostatic chuck 13, and an annular edge ring 15 (also referred to as a focus ring) is placed at the periphery of the electrostatic chuck 13, so as to surround the wafer W. Also, a flow path (not illustrated) is formed in the base 16, to which brine is supplied from a chiller, for example.

An annular exhaust path 23 is formed between the inner side wall of the process chamber 11 and the outer side wall of the mounting platform 12. The exhaust path 23 is connected to an exhaust device 22 via an exhaust port 24. The exhaust device 22 includes a vacuum pump such as a turbomolecular pump or a dry pump. The exhaust device 22 directs gas in the process chamber 11 to the exhaust path 23 and the exhaust port 24, and evacuates. This reduces the process space in the process chamber 11 to a predetermined quality of vacuum.

The exhaust path 23 is provided with a baffle plate 27 that separates the processing space from an exhaust space and that controls flow of gas. The baffle plate 27 is an annular member formed from, for example, aluminum whose surface is coated with a corrosion-resistant film (e.g., yttrium oxide ($Y_2O_3$)), and multiple through-holes are formed.

The mounting platform 12 is connected to a first radio frequency power supply 17 and a second radio frequency power supply 18. The first radio frequency power supply 17 applies, to the mounting platform 12, radio frequency electric power for plasma generation (hereinafter referred to as "HF power") having a frequency of 60 MHz for example. The second radio frequency power supply 18 applies, to the mounting platform 12, radio frequency electric power for attracting ions (hereinafter referred to as "LF power") having a frequency of 40 MHz for example. Thus, the mounting platform 12 also functions as a lower electrode.

At an opening of the ceiling of the process chamber 11, a showerhead 20 having a ring-shaped insulating member 28 along its circumference is provided. The HF power is applied capacitively between the mounting platform 12 and the showerhead 20, and a plasma is generated from a gas, primarily by the HF power.

Ions in the plasma are drawn to the mounting platform 12 by the LF power applied to the mounting platform 12, and impinge on the wafer W placed on the mounting platform 12. Thus, a predetermined film on the wafer W is efficiently treated, such as etched.

A gas supply source 19 supplies gases according to process conditions of each plasma treatment step, such as an etching step, a cleaning step, and a seasoning step. The gas enters the showerhead 20 via a gas line 21, and is introduced into the process chamber 11 in a shower-like manner, from a large number of gas holes 26 via a gas diffusion chamber 25.

A passage 11c is formed in the side wall of the process chamber 11. As will be described below, the wafer W and the edge ring 15 are transported between the inner space of the process chamber 11 and the exterior of the process chamber 11 through the passage 11c. The passage 11c is opened and closed by a gate valve GV provided along the side wall of the process chamber 11.

Also, in the mounting platform 12, through-holes 12h passing through the base 16 and the electrostatic chuck 13 are provided. Support pins 31 are inserted through the respective through-holes 12h. The support pins 31 penetrate the bottom surface of the process chamber 11. The clearance between the support pin 31 and the through-hole 12h is sealed by a sealing member (not illustrated) such that the support pin 31 can slide. Each support pin 31 is configured to move up and down by a lifting device (lifter) 30 provided below the process chamber 11. Although FIG. 1 illustrates a case in which multiple lifting devices 30 are provided, only a single lifting device 30 may be provided, and the single lifting device 30 may be configured to raise and lower all of the support pins 31.

Figure 2A:
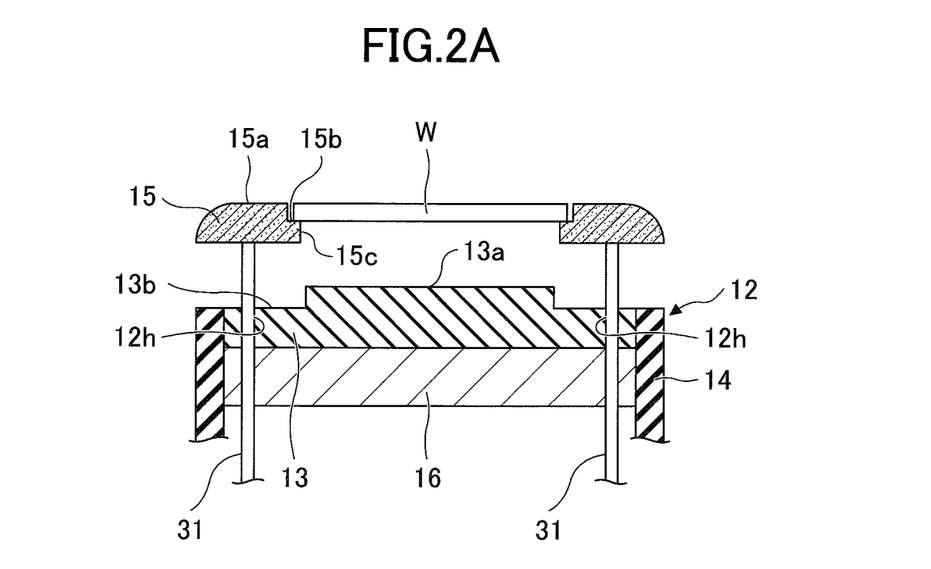
FIGS. 2A and 2B are cross-sectional diagrams Illustrating an operation of a mounting platform provided in the plasma processing apparatus according to the embodiment.
Figure 2B:
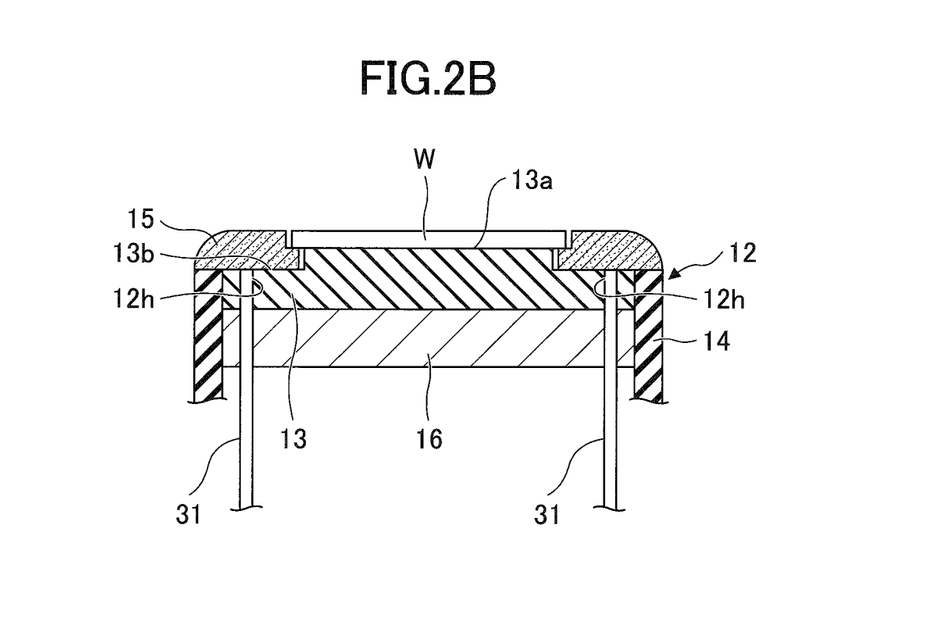

Here, the mounting platform 12 will be further described with reference to FIGS. 2A and 2B and FIG. 3. FIGS. 2A and 2B are cross-sectional diagrams illustrating the operation of the mounting platform 12 provided in the plasma processing apparatus 10 according to the present embodiment. FIG. 2A illustrates a state in which the wafer W is released from the electrostatic chuck 13, and FIG. 2B illustrates a state in which the wafer W is placed on of the electrostatic chuck 13.

Figure 3:
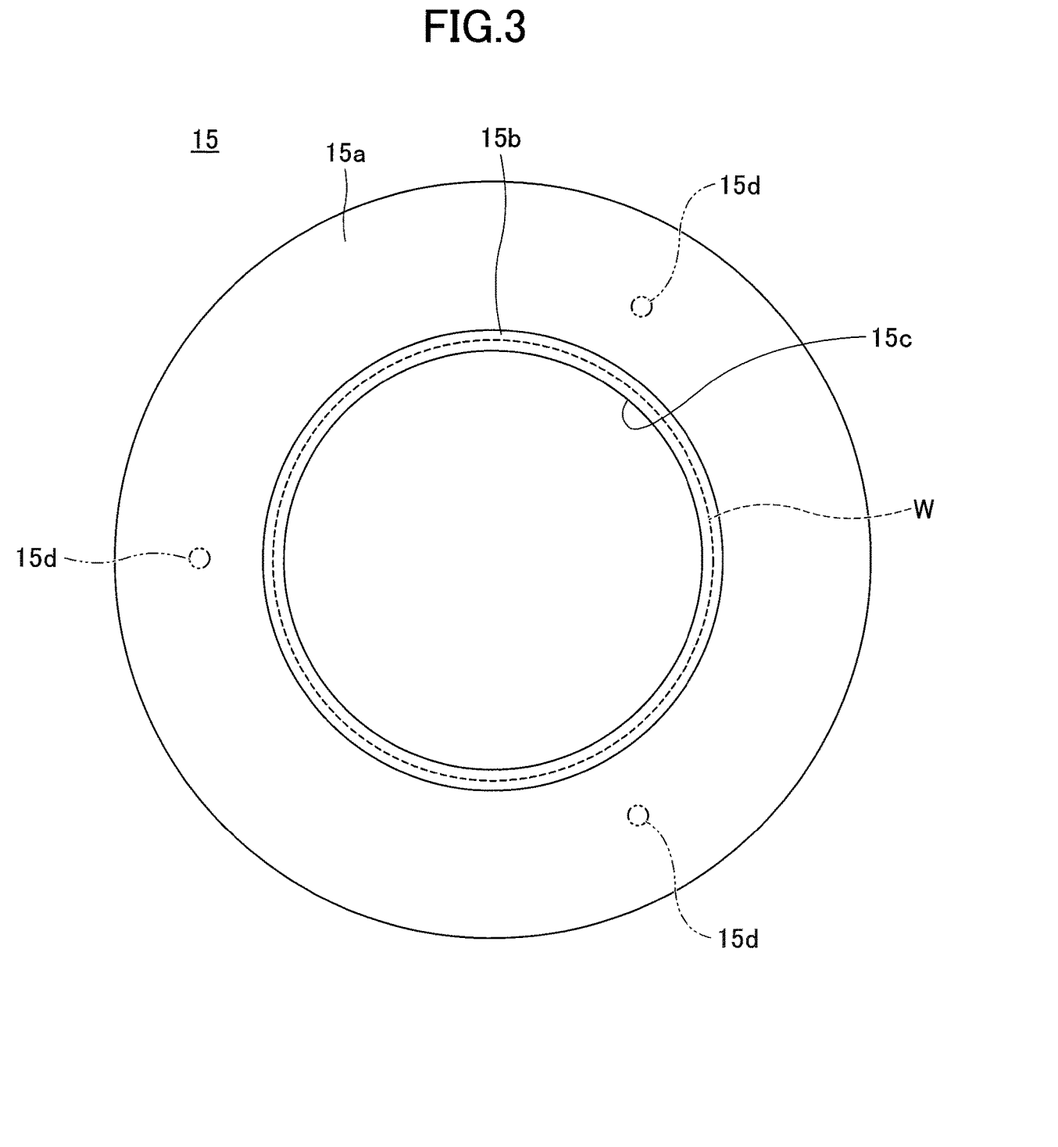
FIG. 3 is a top view of an example of an edge ring used in the plasma processing apparatus according to the embodiment.

FIG. 3 is a top view of an example of the edge ring 15 used in the plasma processing apparatus 10 according to the present embodiment. In FIG. 3, an example of an outer diameter of the wafer W is illustrated by a dashed line.

Here, as illustrated in FIG. 2A or 2B, the electrostatic chuck 13 includes a mounting section 13a on which the wafer W is placed, and a mounting section 13b on which the edge ring 15 is placed. The mounting section 13a is disposed in a disc-like shape at the center of the upper surface of the electrostatic chuck 13. The mounting section 13b is provided in an annular shape on the outside of the mounting section 13a. The upper surface of the mounting section 13a is formed to be higher than the upper surface of the mounting section 13b.

As illustrated in FIGS. 2A and 2B and FIG. 3, the edge ring 15 has an annular portion (annulus) 15a positioned at an outer circumferential side, an annulus 15b (substrate support portion) positioned at an inner circumferential side, and a circular opening 15c. The upper surface of the annulus 15a is formed higher than the upper surface of the annulus 15b. The inner diameter of the annulus 15a is slightly larger than the outer diameter of the wafer W. The inner diameter of the annulus 15b (the diameter of the opening 15c) is slightly smaller than the diameter of the wafer W and slightly larger than the diameter of the mounting section 13a. The height of the mounting section 13a (height from the upper surface of the mounting section 13b to the upper surface of the mounting section 13a) is slightly higher than the height of the annulus 15b (height from the bottom surface of the annulus 15b to the top surface of the annulus 15b). When the wafer W and the edge ring 15 are placed on the mounting platform 12, the upper surface of the wafer W and the upper surface of the annulus 15a of the edge ring 15 may be substantially level.

As illustrated in FIGS. 2A and 2B, the through-holes 12h into which the support pins 31 are inserted are provided in the mounting section 13b of the electrostatic chuck 13. In other words, the through-holes 12h, into which the support pins 31 are inserted, are not provided in the mounting section 13a of the electrostatic chuck 13.

Accordingly, as illustrated in FIG. 2A, by lifting the support pins 31 such that upper ends of the support pins 31 protrude from the through-holes 12h, the upper ends of the support pins 31 contact the bottom surface of the edge ring 15, and lift the edge ring 15. In FIG. 3, an example of positions 15d, at which the support pins 31 contact the bottom surface of the edge ring 15, is illustrated as dashed-and-double-dotted lines. The upper surface of the annulus 15b formed on the inner circumferential side of the edge ring 15 contacts an outer edge of the bottom surface of the wafer W, and lifts the wafer W. That is, both the edge ring 15 and the wafer W can be lifted by lifting the support pins 31.

Further, as illustrated in FIG. 2B, by lowering the support pins 31 such that the upper end of the support pins 31 are accommodated in the through-holes 12h, the bottom surface of the wafer W abuts the upper surface of the mounting section 13a of the electrostatic chuck 13, and the bottom surface of the edge ring 15 abuts the upper surface of the annulus 15b.

Referring back to FIG. 1, a controller 40 includes a CPU, a ROM (Read Only Memory), and a RAM (Random Access Memory). The controller 40 controls various plasma processing steps, and controls an entirety of the plasma processing apparatus 10, in accordance with procedures prescribed in a recipe stored in the RAM.

When performing plasma processing in the plasma processing apparatus 10 having the above-described configuration, a wafer W and an edge ring 15 are loaded into the process chamber 11 first. Specifically, the controller 40 opens the gate valve GV. The wafer W and the edge ring 15 are loaded into the process chamber 11 through the passage 11c by a transfer arm (not illustrated). The controller 40 controls the lifting devices 30 to lift the respective support pins 31, and to support the edge ring 15 with the support pins 31. At this time, the wafer W is supported by the annulus 15b of the edge ring 15. When the transfer arm evacuates from the passage 11c, the controller 40 closes the gate valve GV. Further, the controller 40 controls the lifting devices 30 to lower the respective support pins 31, to place the wafer W on the mounting section 13a of the electrostatic chuck 13, and to place the edge ring 15 on the mounting section 13b of the electrostatic chuck 13 (see FIG. 2B). As the controller 40 applies DC voltage to an electrode (not illustrated) of the electrostatic chuck 13, the wafer W is attracted to and held by the mounting section 13a by Coulomb force. The edge ring 15 is placed on the mounting section 13b by its own weight.

Pressure in the process chamber 11 is reduced to a predetermined value by the exhaust device 22, and the interior of the process chamber 11 is controlled to be in a vacuum state. A predetermined gas is introduced into the process chamber 11 from the showerhead 20 in a shower-like manner. HF power and LF power are applied to the mounting platform 12. In the example of FIG. 1, as the HF power is applied to the mounting platform 12, a plasma generating region P is in close proximity to the wafer W. A plasma is generated from the introduced gas, mainly by the HF power, and plasma treatment, such as etching, is applied to the wafer W by effect of the plasma.

After the plasma processing is completed, the processed wafer W and the edge ring 15 are unloaded from the process chamber 11 of the plasma processing apparatus 10. Specifically, the controller 40 stops applying DC voltage to the electrode of the electrostatic chuck 13 to stop attraction to the wafer W. The controller 40 controls the lifting devices 30 to raise the respective support pins 31, and the edge ring 15 is lifted by the support pins 31. At this time, the wafer W is supported by the annulus 15b of the edge ring 15 (see FIG. 2A). The controller 40 opens the gate valve GV. Subsequently, the transfer arm is inserted into the process chamber 11 via the passage 11c. The controller 40 controls the lifting devices 30 to lower the respective support pins 31, and passes the wafer W and the edge ring 15 to the transfer arm. By the transfer arm, the wafer W and the edge ring 15 are conveyed out of the process chamber 11 via the passage 11c. When the transfer arm evacuates from the passage 11c, the controller 40 closes the gate valve GV. By repeating these steps, successive wafers w are processed.

As described above, in the plasma processing apparatus 10 according to the present embodiment, the through-holes 12h into which the support pins 31 are inserted are formed in the mounting section 13b.

Here, a plasma processing apparatus according to a reference example will be described. In the plasma processing apparatus according to the reference example, through-holes 12h, through which the support pins 31 are inserted, are formed in the mounting section 13a. As the support pins 31 move upward, only the wafer W is lifted. Other configurations are the same and overlapping descriptions are omitted.

Incidentally, discharge may occur in the through-hole 12h (e.g., between the wafer W and the base 16 which acts as the electrode to which the HF power and the LF power are applied). When the through-holes 12h are provided under the bottom surface of the wafer W, as in the plasma processing apparatus according to the reference example, the discharge generated in the through-holes 12h may affect processing of the wafer W. In contrast, in the plasma processing apparatus 10 according to the present embodiment, because the through-holes 12h are provided in a region under the bottom surface of the edge ring 15, even if discharge occurs in the through-holes 12h, any effect on the processing of the wafer W can be reduced.

Also, each of the support pins 31 is provided through the bottom surface of the process chamber 11. Although the clearance between the support pin 31 and the through-hole 12h is sealed by a sealing member (not illustrated) such that the support pin 31 can slide, leakage may occur. If the through-holes 12h are provide under the bottom surface of the wafer W, as in the plasma processing apparatus according to the reference example, occurrence of leakage may affect processing of the wafer W. In contrast, in the plasma processing apparatus 10 according to the present embodiment, because the through-holes 12h are provided under the bottom surface of the edge ring 15, even if leakage occurs, any effect on the processing of the wafer W can be reduced.

Also, the temperature of the mounting platform 12 is controlled by a heater (not illustrated) provided in the base 16 or by brine flowing through a brine flow path (not illustrated). The temperature of the wafer W is adjusted (e.g., heat extraction) through contact with the mounting platform 12. Here, if the through-hole 12h is formed in the mounting section 13a on which the wafer W is placed, as in the plasma processing apparatus according to the reference example, the wafer W does not come into contact with the mounting platform 12 at a location of the through-hole 12h, and thermal conduction between the wafer W and the mounting platform 12 decreases at the location. Therefore, there is a risk that the temperature uniformity in the plane of the wafer W may be reduced. In contrast, the plasma processing apparatus 10 according to the present embodiment can improve temperature uniformity in the plane of the wafer W because the through-hole 12h is provided under the bottom surface of the edge ring 15.

Further, the base 16 is bonded to the electrostatic chuck 13 with an adhesive. When a highly reactive gas or a plasma enters the through-hole 12h, the highly reactive gas or the plasma reacts with the adhesive exposed to an inner surface of the through-hole 12h and may generate gas. At this time, if the through-hole 12h is provided under the bottom surface of the wafer W, as in the plasma processing apparatus according to the reference example, the generated gas is supplied from the through-hole 12h to the bottom of the wafer W, and may affect the processing of the wafer W. In contrast, the plasma processing apparatus 10 according to the present embodiment can reduce influence of the generated gas on the processing of the wafer W, because the through-hole 12h is provided under the bottom surface of the edge ring 15.

In a case in which the through-hole 12h is provided under the bottom surface of the wafer W, as in the plasma processing apparatus according to the reference example, a sleeve may be inserted into the through-hole 12h to prevent the adhesive from being exposed to the inner surface of the through-hole 12h and to suppress generation of gas. In contrast, in the plasma processing apparatus 10 according to the present embodiment, because the through-hole 12h is provided under the bottom surface of the edge ring 15, influence of the generated gas on the processing of the wafer W can be reduced. Thus, as the sleeve may be omitted, the number of parts and the number of assembly steps can be reduced, and cost is reduced.

In addition, in the plasma processing apparatus 10 according to the present embodiment, because the through-holes 12h are provided on an outer circumferential side relative to the mounting section 13a, flexibility in design of the brine flow passage that is formed below the mounting section 13a of the electrostatic chuck 13 on which the wafer W is placed is improved. This can improve, for example, temperature uniformity in the plane of the wafer W.

Further, in the plasma processing apparatus 10 according to the present embodiment, as the edge ring 15 is unloaded from the process chamber 11 together with the wafer W, it is easy to check wear status of the edge ring 15. This allows timing of the replacement of the edge ring 15 to be appropriately determined.

Figure 4A:
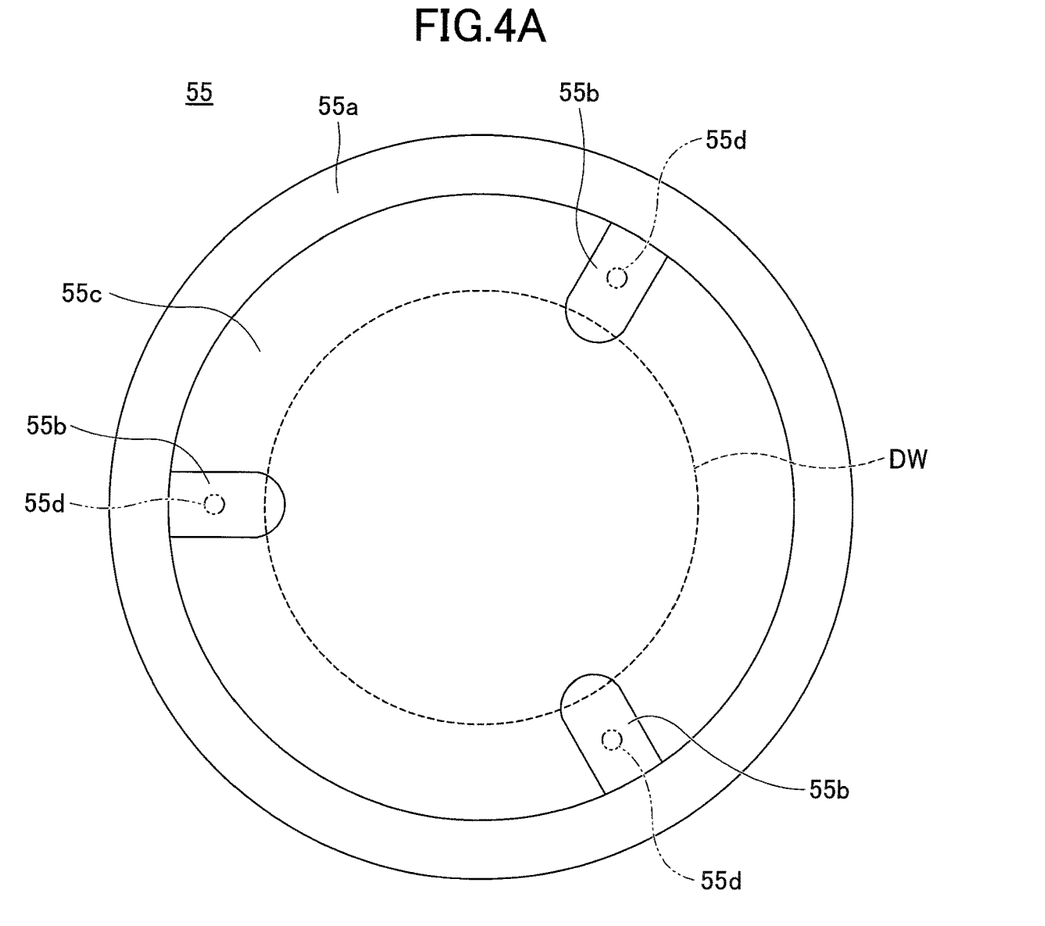
FIG. 4A is a top view of an example of another edge ring.
Figure 4B:
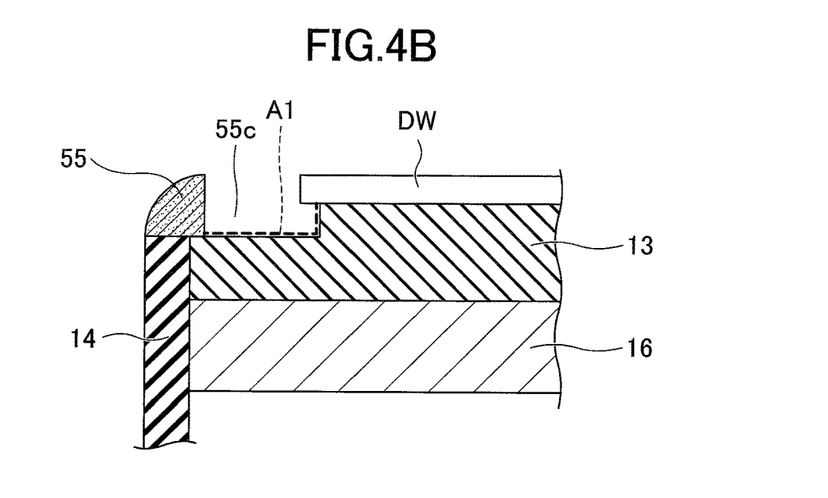
FIG. 4B is a sectional view schematically illustrating a part of the mounting platform when said another edge ring is used.

Also, in the plasma processing apparatus 10 according to the present embodiment, because a wafer W is unloaded from the process chamber 11 together with the edge ring 15, another edge ring 55 that is different from the edge ring 15 (see FIG. 3) used in processing the wafer W can also be placed easily. FIG. 4A is a top view of an example of the another edge ring 55. FIG. 4B is a sectional view schematically illustrating a part of the mounting platform 12 when the another edge ring 55 is used. In FIG. 4A, an example of an outer diameter of a wafer (dummy wafer DW) that is transported with the another edge ring 55 is illustrated as a dashed line. Note that the another edge ring 55 and the dummy wafer DW are used in a cleaning step that will be described below.

The another edge ring 55 has an annulus 55a positioned at an outer circumferential side and protrusions (substrate support portions) 55b protruding toward the center of the annulus 55a. The annulus 55a is formed such that the upper surface of the annulus 55a is positioned higher than the upper surface of the protrusions 55b. The inner diameter of the annulus 55a is formed to be sufficiently larger than the outer diameter of the dummy wafer DW. The protrusions 55b support the dummy wafer DW with the upper surfaces of the protrusions 55b. When the dummy wafer DW is placed on the protrusions 55b of the another edge ring 55, an opening 55c, which opens in the thickness direction of the another edge ring 55, is formed between the dummy wafer DW and the annulus 55a. In FIG. 4A, an example of contact positions 55d, at which the support pins 31 contact the bottom surface of the another edge ring 55, is illustrated as dashed-and-double-dotted lines. Although FIG. 4A illustrates a case in which the contact positions 55d may be located in the protrusions 55b, the contact positions 55d may be located in the annulus 55a.

Next, the cleaning step of the plasma processing apparatus 10 according to the present embodiment will be described. In the cleaning step, the another edge ring 55 and a dummy wafer DW are loaded into the plasma processing apparatus 10. The another edge ring 55 and the dummy wafer DW can be loaded into the plasma processing apparatus 10 in the same manner as the edge ring 15 and the wafer W.

The pressure in the process chamber 11 is reduced to a predetermined value by the exhaust device 22, and the interior of the process chamber 11 is controlled to be in a vacuum state. From the showerhead 20, a cleaning gas is introduced into the process chamber 11 in a shower-like manner. The HF power and LF power are applied to the mounting platform 12. A plasma is generated from the introduced cleaning gas mainly by the HF power, and the cleaning process is performed by effect of the plasma.

Here, because the dummy wafer DW is placed on the upper surface of the mounting section 13a of the electrostatic chuck 13, the dummy wafer DW prevents the upper surface of the mounting section 13a from being exposed to plasma. The side surface of the mounting section 13a and the upper surface of the mounting section 13b, which correspond to a region A1 in FIG. 4B (a region illustrated as a dashed line A1), are cleaned by the plasma entering from the opening 55c of the another edge ring 55. This can remove deposits that are deposited between the edge ring 15 and the mounting platform 12, to restore thermal conductivity. In addition, in the cleaning process according to the present embodiment, the upper surface of the mounting section 13a is prevented from being eroded by a plasma.

After the cleaning process is completed, the another edge ring 55 and the dummy wafer DW are unloaded from the process chamber 11 of the plasma processing apparatus 10. The other edge ring 55 and the dummy wafer DW can be unloaded in the same manner as the edge ring 15 and the wafer W.

Figure 5:
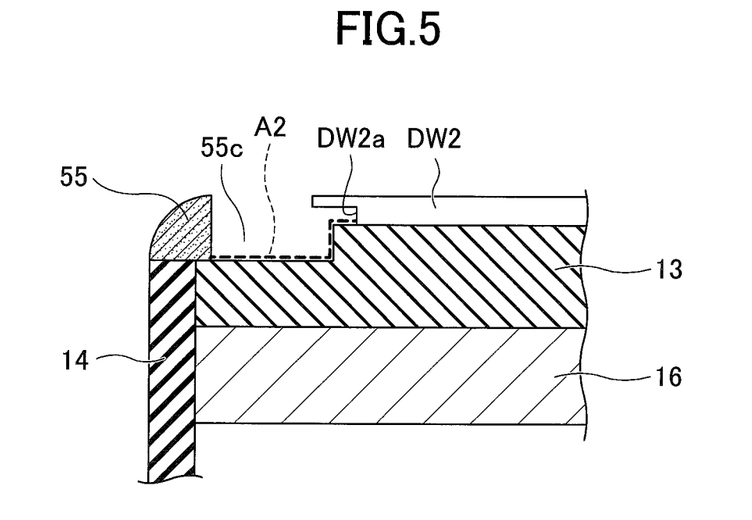
FIG. 5 is a sectional view schematically illustrating a part of the mounting platform when said another edge ring and another dummy wafer are used.

The shape of the dummy wafer DW is not limited to the disc, shape illustrated in FIG. 4. FIG. 5 is a sectional view schematically illustrating a part of the mounting platform 12 when the another edge ring 55 and another dummy wafer DW2 are used. As illustrated in FIG. 5, an annular notch DW2a is formed at the bottom surface side of the outer circumference of the another dummy wafer DW2. An outer diameter of the other dummy wafer DW2 at the notch DW2a is smaller than the outer diameter of the mounting section 13a. Accordingly, an outer edge of the upper surface of the mounting section 13a, the side surfaces of the mounting section 13a, and the upper surface of the mounting section 13b, which correspond to a region A2 in FIG. 5 (a region illustrated as a dashed line A2), can be cleaned.

<Substrate Processing System>

Figure 6:
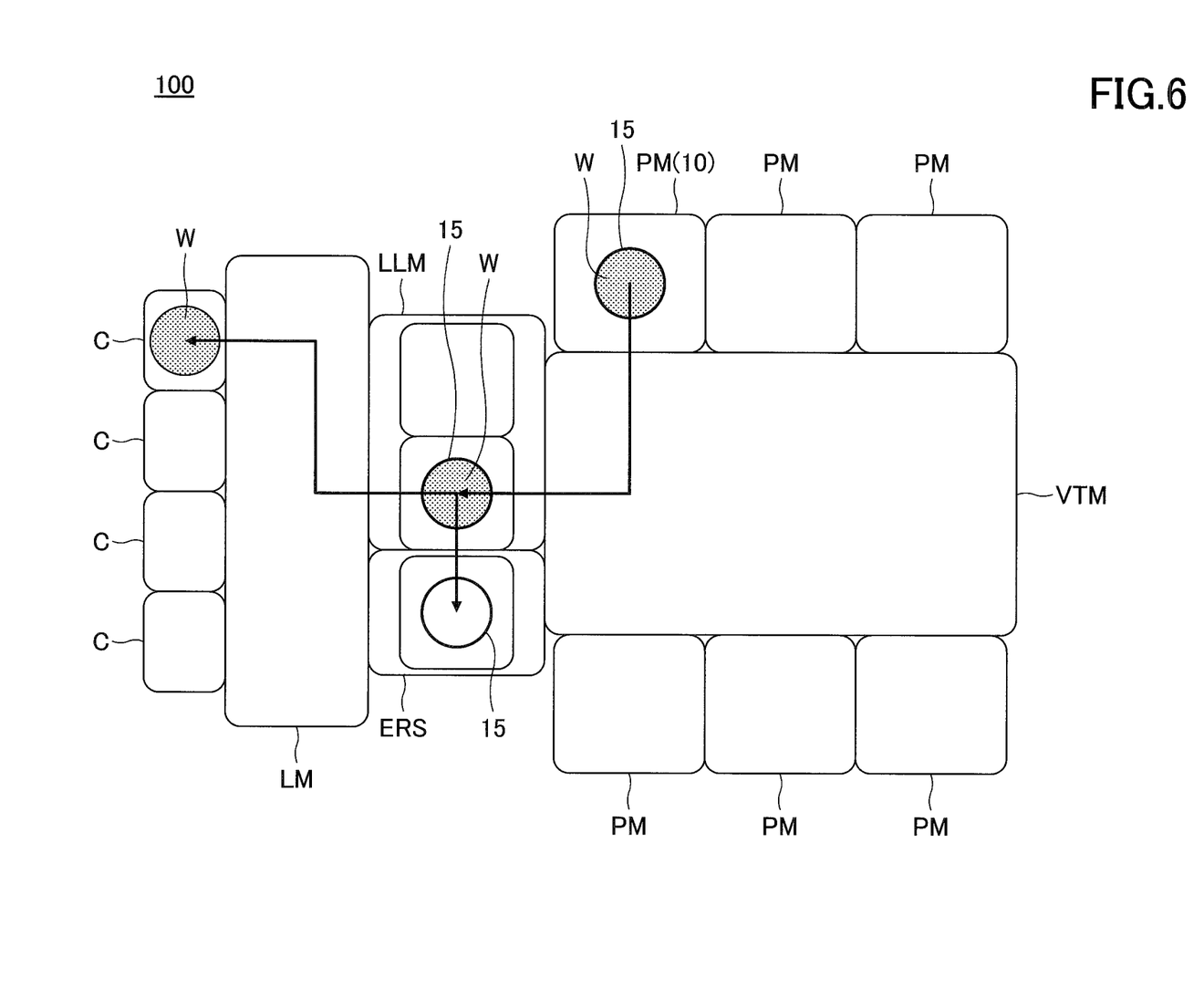
FIG. 6 is an example of a schematic diagram of a configuration of a substrate processing system according to the embodiment.

Next, a substrate processing system 100 according to the present embodiment will be described with reference to FIG. 6. FIG. 6 is an example of a schematic diagram of the configuration of the substrate processing system 100 according to the present embodiment.

The substrate processing system 100 is a cluster-structured (multi-chamber type) system. The substrate processing system 100 includes process modules (PM), a vacuum transport module (VTM), a load lock module (LLM), a loader module (LM), carriers (C), and an edge ring stocker (ERS).

Each process module PM corresponds to the plasma processing apparatus 10 illustrated in FIG. 1 and the like. The gate valve GV (see FIG. 1) is provided between each process modules PM and the vacuum transport module VTM.

The vacuum transport module VTM is depressurized to a predetermined vacuum atmosphere. The transfer arm (not illustrated) for transporting the wafer W and the edge ring 15 is provided inside the vacuum transport module VTM.

The load lock module LLM is provided between the vacuum transport module VTM and the loader module LM. The load lock module LLM allows switching between atmospheric pressure and vacuum pressure. A gate valve (not illustrated) is provided between the load lock module LLM and the vacuum transport module VTM. A gate valve (not illustrated) is provided between the load lock module LLM and the loader module LM.

The loader module LM is maintained at an atmospheric pressure, and, for example, a downflow of clean air is formed in the loader module LM. A transfer arm (not illustrated) for conveying the wafer W is provided inside the loader module LM.

The carriers C that accommodate wafers W are attached to the wall of the loader module LM. For example, FOUP (Front Opening Unified Pod) or the like may be used as the carrier C.

The edge ring stocker ERS is provided adjacent to the load lock module LLM. A gate valve (not illustrated) may be provided between the load lock module LLM and the edge ring stocker ERS. The edge ring stocker ERS accommodates edge rings 15. The edge ring stocker ERS includes a transfer arm (not illustrated), which places an edge ring 15 accommodated in the edge ring stocker ERS onto a mounting section of the load lock module LLM, and which stores an edge ring 15 placed on the mounting section of the load lock module LLM into the edge ring stocker ERS.

Next, transportation of the wafer W and the edge ring 15 in the substrate processing system 100 will be described. Here, an example will be described, in which a wafer W processed in the process module PM (plasma processing apparatus 10) and an edge ring 15 are unloaded from the process module PM. In FIG. 6 (and FIGS. 7 and 8, which will be described below), a flow of transportation of the wafer w and the edge ring 15 is illustrated by an arrow. Note that, because the operation of loading an unprocessed wafer W and the edge ring 15 is the same as the procedure of unloading the processed wafer in reverse, description of the loading operation will be omitted.

First, by the transfer arm of the vacuum transport module VTM, the wafer W processed in the process module PM and the edge ring 15 are unloaded from the process module PM, and are loaded into the load lock module LLM via the vacuum transport module VTM. Here, a mounting platform (not illustrated) of the load lock module LLM includes, for example, first support pins (not illustrated) that support the wafer W, and second support pins (not illustrated) that support the edge ring 15. As the load lock module LLM, unlike the process module PM, does not process the wafer W, even if through-holes of the first support pins (not illustrated) are provided in an area of the mounting platform of the load lock module LLM on which the wafer W is placed, the through-holes do not affect the wafer W. After the load lock module LLM is switched to an atmospheric pressure, only the wafer W is lifted by the first support pins. The wafer W is unloaded from the mounting platform of the load lock module LLM by the transfer arm of the loader module LM, and is stored into the carrier C. Thereafter, the edge ring 15 is unloaded from the mounting platform of the load lock module LLM by the transfer arm of the edge ring stocker ERS, and is stored into the edge ring stocker ERS.

Figure 7:
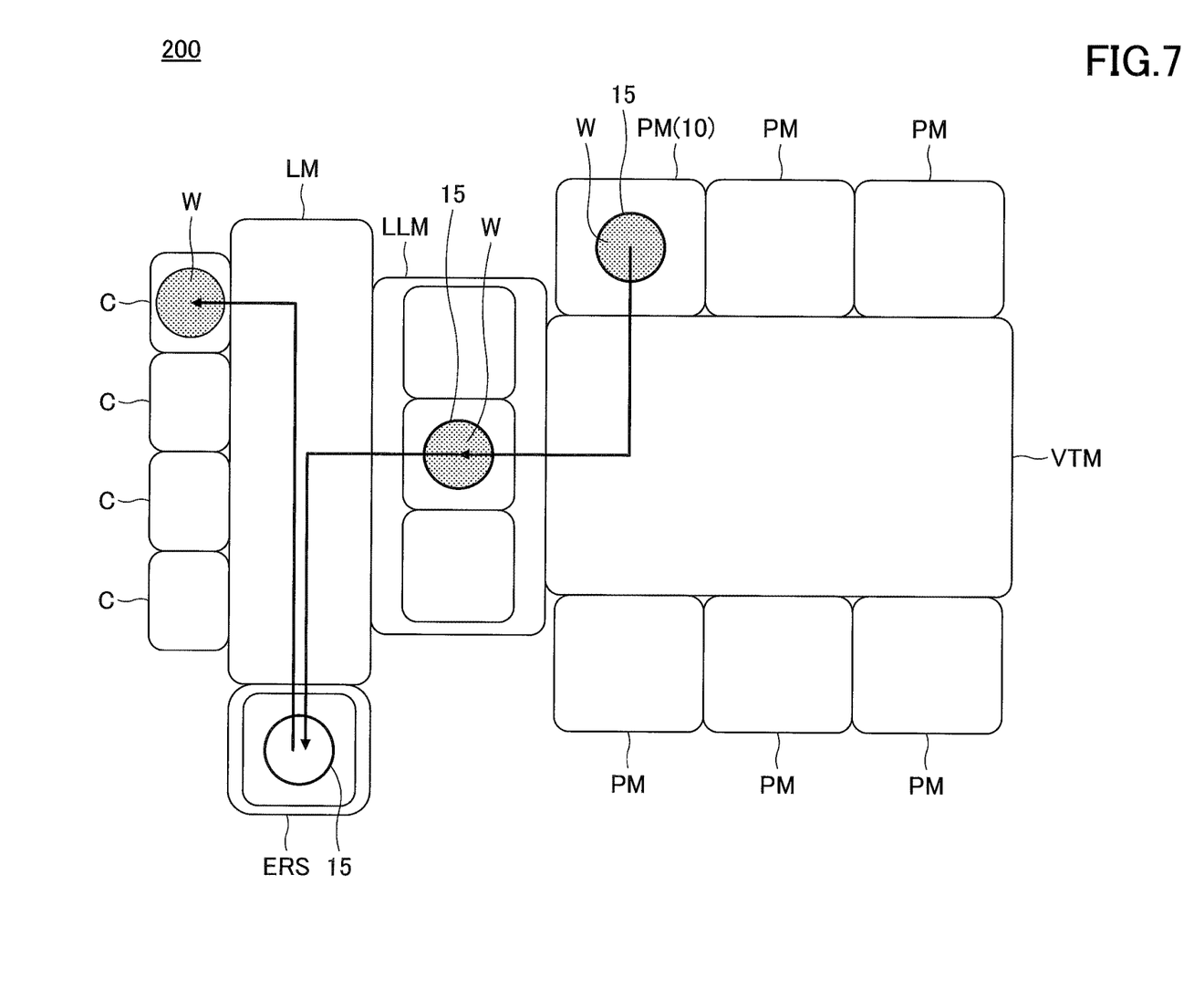
FIG. 7 is an example of a schematic diagram of a configuration of another substrate processing system according to the present embodiment.

Next, another substrate processing system 200 according to the present embodiment will be described with reference to FIG. 7. FIG. 7 is an example of a schematic diagram of the configuration of the substrate processing system 200 according to the present embodiment. The substrate processing system 200 includes process modules PM, a vacuum transport module VTM, a load lock module LLM, a loader module LM, carriers C, and an edge ring stocker ERS.

The edge ring stocker ERS of the substrate processing system 200 is provided adjacent to the loader module LM. The transfer arm of the loader module LM transfers each of a wafer W and an edge ring 15.

Next, transportation of the wafer W and the edge ring 15 in the substrate processing system 200 will be described. Here, an example will be described, in which a wafer W processed in the process module PM (plasma processing apparatus 10) and the edge ring 15 are unloaded.

First, by the transfer arm of the vacuum transport module VTM, the wafer W processed in the process module PM and the edge ring 15 are unloaded from the process module PM and are loaded into the load lock module LLM via the vacuum transport module VTM. A mounting platform (not illustrated) of the load lock module LLM includes, for example, first support pins (not illustrated) that support the wafer W, and second support pins (not illustrated) that support the edge ring 15. After the load lock module LLM is switched to an atmospheric pressure, only the wafer W is lifted by the first support pins. The wafer W is unloaded from the mounting platform of the load lock module LLM by the transfer arm of the loader module LM, and is stored into the carrier C. Thereafter, the edge ring 15 is unloaded from the mounting platform of the load lock module LLM by the transfer arm of the loader module LM, and is stored in the edge ring stocker ERS.

Figure 8:
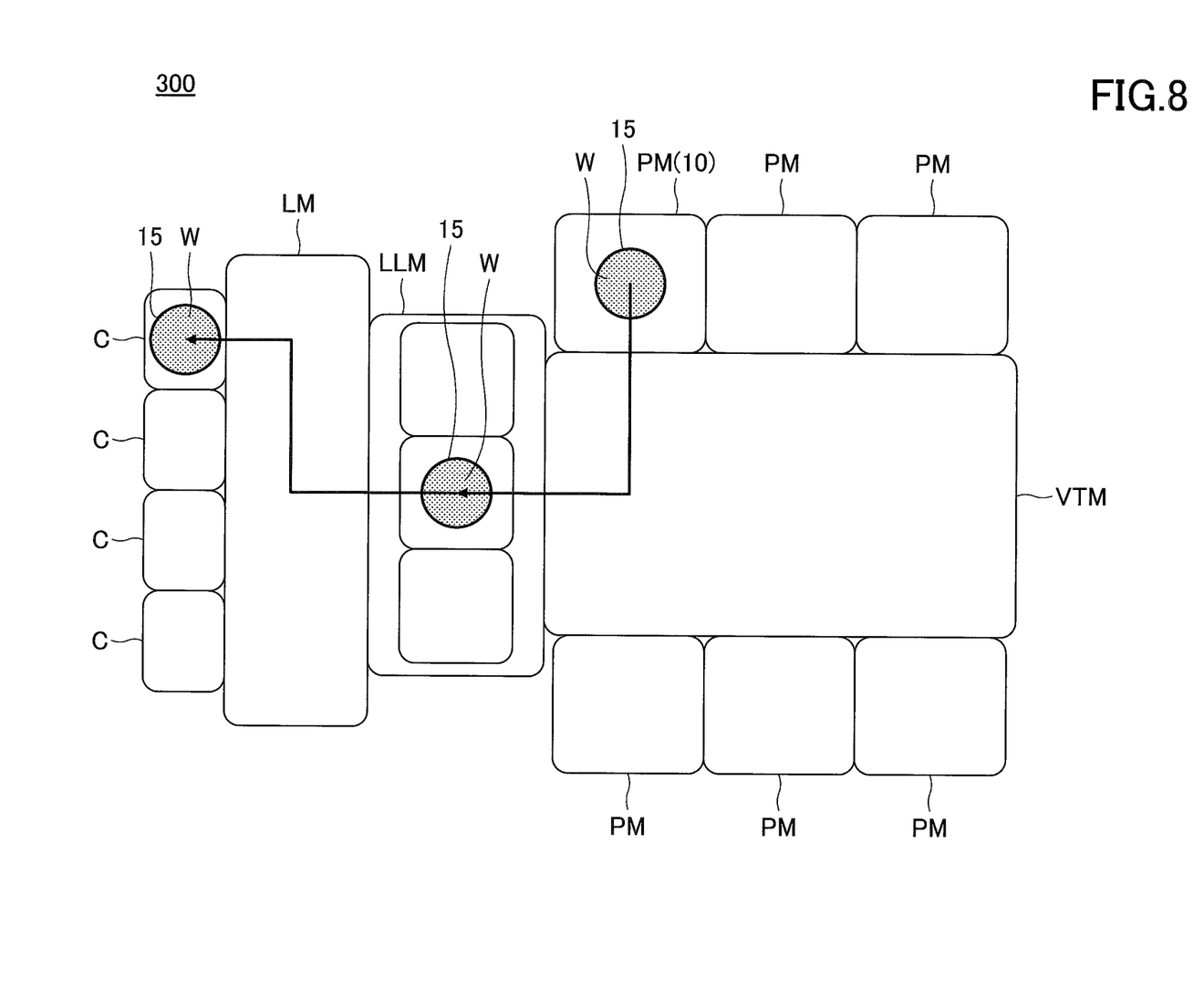
FIG. 8 is an example of a schematic diagram of a configuration of yet another substrate processing system according to the embodiment.

Next, yet another substrate processing system 300 according to the present embodiment will be described with reference to FIG. 8. FIG. 8 is an example of a schematic diagram of the configuration of the substrate processing system 300 according to the embodiment. The substrate processing system 300 includes process modules PM, a vacuum transport module VTM, a load lock module LLM, a loader module LM, and carriers C.

The substrate processing system 300 also accommodates a wafer W with an edge ring 15 in the carrier C.

Next, transportation of the wafer W and the edge ring 15 in the substrate processing system 300 will be described. Here, an example will be described, in which a wafer W processed in the process module PM (plasma processing apparatus 10) and an edge ring 15 are unloaded from the process module PM.

First, by a transfer arm of the vacuum transport module VTM, the wafer W processed in the process module PM and the edge ring 15 are unloaded from in the process module PM, and are loaded into the load lock module LLM via the vacuum transport module VTM. A mounting platform (not illustrated) of the load lock module LLM includes, for example, support pins (not illustrated) that support the edge ring 15. After the load lock module LLM is switched to an atmospheric pressure, the edge ring 15 is lifted by the support pins. The wafer W and the edge ring 15 are unloaded from the mounting platform of the load lock module LLM by a transfer arm of the loader module LM, and are stored into the carrier C.

Although the embodiments of the plasma processing apparatus 10 and the substrate processing systems 100 to 300 have been described above, the present disclosure is not limited to the above-described embodiments. Various modifications and enhancements can be made within the scope of the gist of the present disclosure as claimed.

Figure 9A:
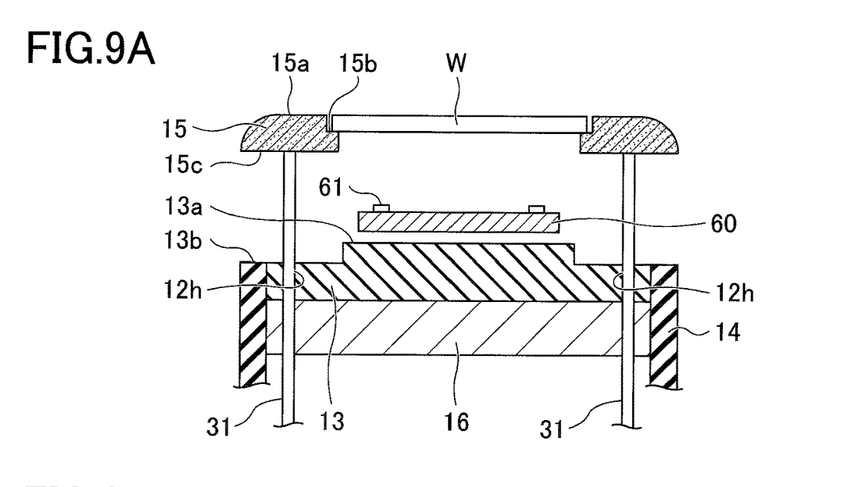
FIGS. 9A to 9C are cross-sectional diagrams illustrating another transporting method in the plasma processing apparatus according to the embodiment.
Figure 9B:
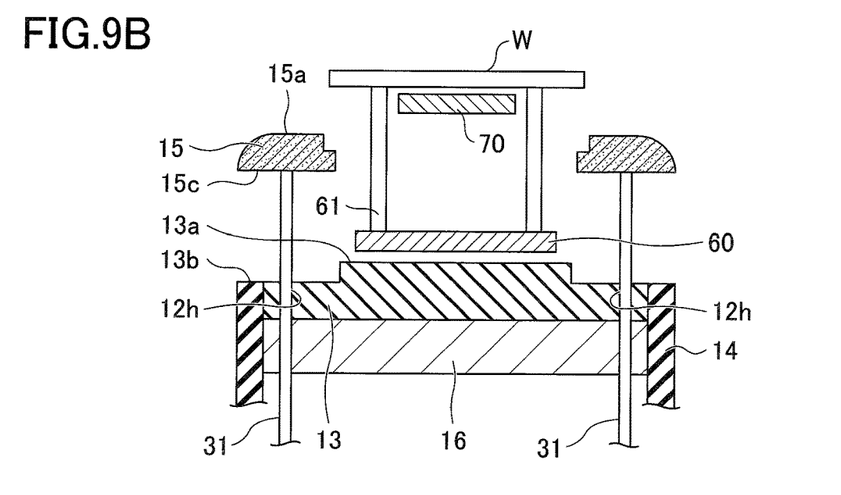
Figure 9C:
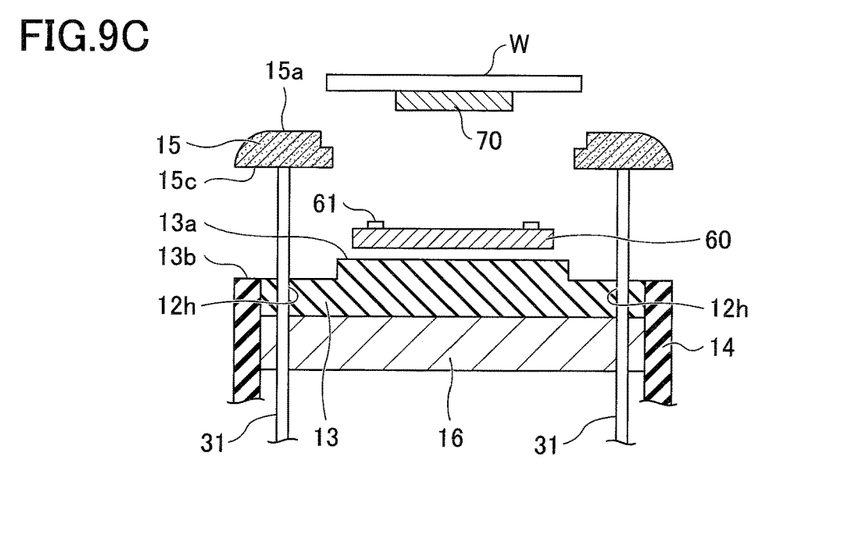

In the above-described embodiments, a wafer W and an edge ring 15 are transported by a transfer arm in the plasma processing apparatus 10. However, the transporting method is not limited to the above. FIGS. 9A to 9C are cross-sectional diagrams illustrating another transporting method in the plasma processing apparatus 10 according to the present embodiment.

A transfer arm includes a first transfer arm 60 and a second transfer arm 70. The first transfer arm 60 includes a lifting section 61 that lifts a wafer W from an edge ring 15.

Next, another transporting method of transporting a wafer W in the plasma processing apparatus 10 will be described. Here, a case in which a wafer W is unloaded will be described. Because the operation of loading the wafer W is the same as the procedure of unloading the wafer in reverse, description of the loading operation will be omitted.

First, the support pins 31 are raised to lift the edge ring 15. At this time, the wafer W is supported by the annulus 15b of the edge ring 15. Next, the first transfer arm 60 is inserted between the edge ring 15 and the electrostatic chuck 13. This state is illustrated in FIG. 9A.

Next, the lifting section 61 of the first transfer arm 60 is raised to lift the wafer W from the edge ring 15. The second transfer arm 70 is then inserted between the wafer W and the edge ring 15. This state is illustrated in FIG. 9B.

By lowering the lifting section 61 of the first transfer arm 60, the wafer W is passed to the second transfer arm 70. This state is illustrated in FIG. 9C.

Thereafter, the wafer W is unloaded from the process chamber 11 by the second transfer arm 70. Also, the first transfer arm 60 evacuates from the process chamber 11. Next, by lowering the support pins 31, the edge ring 15 is placed on the mounting section 13b.

According to the above-described configuration, only the wafer W can be loaded into and unloaded from the plasma processing apparatus 10. Accordingly, in the above-described configuration, a conventional substrate processing in which only a wafer W is transported can be used.

The plasma processing apparatus of the present disclosure is applicable to any of the following types of processing apparatuses: an atomic layer deposition (ALD) apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

The present disclosure is not limited to a plasma processing apparatus, but may also be applied to another substrate processing apparatus (for example, a thermal CVD apparatus and the like) that does not use a plasma for processing a wafer W.

What is claimed is:

1. An apparatus for substrate processing comprising:
   a stage including a first section for supporting a substrate and a second section for supporting an edge ring, the second section being provided at a periphery of the first section;
   holes that penetrate the stage, each of the holes being provided at the second section;
   pins that are provided in the respective holes, such that the pins can move up and down through the holes;
   a lifter configured to raise and lower the pins; and
   a controller configured to control the lifter,
   wherein the edge ring includes
      an annular portion, and
      a support portion provided at an inter circumference of the annular portion, the support portion being configured to support the substrate when transporting the substrate and the edge ring,
   wherein, when the substrate is placed on the support portion, an opening that opens in a thickness direction of the edge ring is formed between the substrate and the annular portion, and
   wherein an annular notch is formed at a bottom surface side of an outer circumference of the substrate.

2. A system for substrate processing comprising:
   the apparatus according to claim 1; and
   a carrier that accommodates the substrate and the edge ring.

3. A system for substrate processing comprising:
   the apparatus according to claim 1;
   a carrier that accommodates the substrate; and
   a stocker that accommodates the edge ring; wherein
   the system is configured, when transporting the substrate from the apparatus to the carrier,
      to separate the substrate from the edge ring on a route for transporting the substrate from the apparatus to the carrier;
      to store the substrate into the carrier; and
      to store the edge ring to the stocker.

4. A system for substrate processing comprising:
   the apparatus according to claim 1; and
   a carrier that accommodates the substrate and the edge ring.

5. A system for substrate processing comprising:
   an apparatus including (i) a stage including a first section for supporting a substrate and a second section for supporting an edge ring, the second section being provided at a periphery of the first section, (ii) holes that penetrate the stage, each of the holes being provided at the second section, (iii) pins that are provided in the respective holes, such that the pins can move up and down through the holes, (iv) a lifter configured to raise and lower the pins, and (v) a controller configured to control the lifter;
   a carrier that accommodates the substrate; and
   a stocker that accommodates the edge ring; wherein
   the system is configured, when transporting the substrate from the apparatus to the carrier,
      to separate the substrate from the edge ring on a route for transporting the substrate from the apparatus to the carrier;
      to store the substrate into the carrier; and
      to store the edge ring to the stocker.

* * * * *